US008330142B2

United States Patent
Cho et al.

(10) Patent No.: US 8,330,142 B2
(45) Date of Patent: Dec. 11, 2012

(54) QUANTUM DOT LIGHT EMITTING DEVICE HAVING QUANTUM DOT MULTILAYER

(75) Inventors: Kyung-sang Cho, Gwacheon-si (KR); Byoung-lyong Choi, Seoul (KR); Eun-kyung Lee, Suwon-si (KR); Tae-ho Kim, Masan-si (KR); Sang-jin Lee, Anyang-si (KR)

(73) Assignee: Samsung Electronics Co., Ltd. (KR)

( * ) Notice: Subject to any disclaimer, the term of this patent is extended or adjusted under 35 U.S.C. 154(b) by 309 days.

(21) Appl. No.: 12/708,664

(22) Filed: Feb. 19, 2010

(65) Prior Publication Data
US 2010/0213438 A1     Aug. 26, 2010

(30) Foreign Application Priority Data
Feb. 23, 2009  (KR) .................. 10-2009-0014894

(51) Int. Cl.
*H01L 21/02* (2006.01)
(52) U.S. Cl. ............... 257/14; 257/21; 257/40; 257/48; 257/89; 257/98; 257/E21.114; 257/E33.002; 257/E33.008; 257/E51.021; 257/E51.027; 977/774; 977/900; 977/950
(58) Field of Classification Search .............. 257/13, 257/14, 21, 22, 40, 48, 51, 79, 89, 94, 99, 257/E21.04, 114, 33.002, 4, 5, 8, 74, 51.021, 257/27; 977/774, 900, 950
See application file for complete search history.

(56) References Cited

U.S. PATENT DOCUMENTS

| | | | |
|---|---|---|---|
| 6,846,565 B2 * | 1/2005 | Korgel et al. ............... 428/402 |
| 7,777,233 B2 * | 8/2010 | Kahen et al. ................ 257/79 |
| 7,888,857 B2 * | 2/2011 | Choi et al. .................. 313/503 |
| 7,957,621 B2 * | 6/2011 | Zhang et al. ................ 385/131 |
| 8,120,010 B2 * | 2/2012 | Cho et al. .................... 257/13 |
| 2003/0042850 A1 | 3/2003 | Bertram et al. |
| 2005/0001538 A1 | 1/2005 | Ozkan et al. |
| 2006/0158098 A1 | 7/2006 | Raychaudhuri et al. |
| 2007/0103068 A1 | 5/2007 | Bawendi et al. |
| 2007/0194694 A1 | 8/2007 | Reddy |
| 2008/0006817 A1* | 1/2008 | Kawaguchi ................ 257/14 |
| 2008/0087899 A1 | 4/2008 | Sargent et al. |

(Continued)

FOREIGN PATENT DOCUMENTS

EP    2 184 333 A2    5/2010
(Continued)

OTHER PUBLICATIONS

European Search Report for Application No. 10154101.9-1235 dated Jul. 16, 2010.

*Primary Examiner* — Michael Lebentritt
(74) *Attorney, Agent, or Firm* — Cantor Colburn LLP

(57) ABSTRACT

A quantum dot light emitting device includes; a substrate, a first electrode disposed on the substrate, a second electrode disposed substantially opposite to the first electrode, a first charge transport layer disposed between the first electrode and the second electrode, a quantum dot light emitting layer disposed between the first charge transport layer and one of the first electrode and the second electrode, and at least one quantum dot including layer disposed between the quantum dot light emitting layer and the first charge transport layer, wherein the at least one quantum dot including layer has an energy band level different from an energy band level of the quantum dot light emitting layer.

19 Claims, 9 Drawing Sheets

U.S. PATENT DOCUMENTS

| | | | |
|---|---|---|---|
| 2008/0180020 A1* | 7/2008 | Cok | 313/503 |
| 2008/0206565 A1 | 8/2008 | Takahashi et al. | |
| 2008/0218068 A1* | 9/2008 | Cok | 313/505 |
| 2008/0231178 A1 | 9/2008 | Park et al. | |
| 2008/0309234 A1 | 12/2008 | Cho et al. | |
| 2010/0213437 A1* | 8/2010 | Akai et al. | 257/13 |
| 2010/0308754 A1* | 12/2010 | Gough et al. | 315/363 |
| 2011/0140075 A1* | 6/2011 | Zhou et al. | 257/13 |
| 2011/0284819 A1* | 11/2011 | Kang et al. | 257/9 |

FOREIGN PATENT DOCUMENTS

| | | |
|---|---|---|
| JP | 2004031323 A | 1/2004 |
| JP | 2004363436 A | 12/2004 |
| JP | 2005025998 A | 1/2005 |
| JP | 2006041396 A | 2/2006 |
| KR | 1020070097255 A | 10/2007 |
| KR | 1020080056746 A | 6/2008 |
| WO | 2008/063657 A2 | 5/2008 |

* cited by examiner

QUANTUM DOT LIGHT EMITTING DEVICE HAVING QUANTUM DOT MULTILAYER

CROSS-REFERENCE TO RELATED APPLICATION

This application claims priority to Korean Patent Application No. 10-2009-0014894, filed on Feb. 23, 2009, and all the benefits accruing therefrom under 35 U.S.C. §119, the content of which in its entirety is herein incorporated by reference.

BACKGROUND

1. Field

One or more embodiments relate to a quantum dot light emitting device, and more particularly, to a quantum dot light emitting device having a quantum dot multilayer including quantum dots.

2. Description of the Related Art

Organic light emitting devices ("OLEDs") typically have a multilayered thin film structure mainly formed of a low molecular weight organic material. A display device using such an OLED has certain advantages such as a variety of materials may be selected for forming an internal thin film, a high purity thin film may be formed and a high light emitting performance may be obtained therefrom. In contrast, there are problems and disadvantages associated with the use of an OLED such as oxidation or crystallization of the OLED through reaction with an external toxic material and the manufacturing of an OLED includes a complicated and expensive film formation process because the OLED is typically formed at a predetermined position using vacuum deposition.

Recently, research focus on a light emitting device using the light emitting characteristic of a quantum dot ("QD") has increased. A QD is a particle formed of a semiconductor material having a crystal structure of a size smaller than the radius of a Bohr exciton, that is, the typical QD is only several nanometers in size. Although numerous electrons exist in the QD, the number of free electrons is limited to about 1-100. In this case, the energy levels of electrons are discontinuously limited so that electric and optical characteristics of the QD may be different from those of a semiconductor in a bulk state forming a continuous band. Since the energy level of the QD varies according to the size thereof, a band gap, and therefore an energy of a photon resulting from the band gap, may be controlled by simply changing the size of the QD. That is, the light emitting wavelength of the QD may be adjusted by simply adjusting the size thereof.

A typical quantum dot light emitting device ("QD-LED"), in which the QD is used for forming a light emitting layer, has a basic structure of three layers, that is: a QD light emitting layer, and a hole transport layer ("HTL") and an electron transport layer ("ETL") which are respectively located at either end of the QD light emitting layer.

SUMMARY

One or more embodiments include a quantum dot light emitting device ("QD-LED") which may have a reduced difference in an energy band level between a QD light emitting layer and an HTL due to use of a QD containing layer in addition to the QD light emitting layer, the QD containing layer having an energy band level different from the QD light emitting layer.

Additional aspects will be set forth in part in the description which follows and, in part, will be apparent from the description, or may be learned by practice of the presented embodiments.

To achieve the above and/or other aspects, one or more embodiments may include a quantum dot light emitting device including; a substrate, a first electrode disposed on the substrate, a second electrode disposed substantially opposite to the first electrode, a first charge transport layer disposed between the first electrode and the second electrode, a quantum dot light emitting layer disposed between the first charge transport layer and one of the first electrode and the second electrode, and at least one quantum dot including layer disposed between the quantum dot light emitting layer and the first charge transport layer, wherein the at least one quantum dot containing layer includes an energy band level different from an energy band level of the quantum dot light emitting layer.

In one embodiment, the quantum dot light emitting device may further include a second charge transport layer.

In one embodiment, one of the first and second charge transport layers may be a hole transport layer and the other one may be an electron transport layer, and the at least one quantum dot including layer may be disposed on the hole transport layer and the quantum dot light emitting layer may be disposed on the at least one quantum dot including layer.

In one embodiment, the at least one quantum dot including layer may have substantially the same band gap as that of the quantum dot light emitting layer.

In one embodiment, the at least one quantum dot including layer may include a single quantum dot including layer, and energy band levels of the quantum dot light emitting layer, the quantum dot including layer, and the hole transport layer may be arranged to each be sequentially higher than the preceding layer.

In one embodiment, the at least one quantum dot including layer may include a first quantum dot including layer and a second quantum dot including layer, and energy band levels of the quantum dot light emitting layer, the first and second quantum dot including layers, and the hole transport layer may be arranged to each be sequentially higher than the preceding layer.

In one embodiment, the at least one quantum dot including layer may include a first quantum dot including layer and a second quantum dot including layer respectively arranged at opposing sides of the quantum dot light emitting layer, and band gaps of the first quantum dot including layer and the second quantum dot including layer may be greater than a band gap of the quantum dot light emitting layer.

In one embodiment, the first quantum dot including layer, the quantum dot light emitting layer, and the second quantum dot including layer may be sequentially stacked on the hole transport layer, and energy band levels of the quantum dot light emitting layer, the first quantum dot including layer, and the hole transport layer may be arranged to each be sequentially higher than the preceding layer.

In one embodiment, the first charge transport layer and the second charge transport layer may include a dielectric material, and the at least one quantum dot including layer may include a first quantum dot including layer and a second quantum dot including layer respectively arranged at opposing sides of the quantum dot light emitting layer.

In one embodiment, band gaps of the first quantum dot including layer and the second quantum dot including layer may be greater than a band gap of the quantum dot light emitting layer In one embodiment, the first quantum dot including layer, the quantum dot light emitting layer, and the second quantum dot including layer may be sequentially stacked on the first or second charge transport layers, and energy band levels of the quantum dot light emitting layer, the first quantum dot including layer, and the first or second charge transport layer may be arranged to each be sequentially higher than the preceding layer.

In one embodiment, the quantum dot light emitting device may further include an alternating current generator connected to the first electrode and the second electrode when the first and second charge transport layers are formed of a dielectric material.

Also disclosed is an embodiment of a method of forming a quantum dot light emitting device, the method including; providing a substrate, providing a first electrode on the substrate, disposing a quantum dot containing layer having a first energy band level on the first electrode, disposing a quantum dot light emitting layer having a second energy band level on the quantum dot containing layer, wherein the second energy band level is different than the first energy band level, and disposing a second electrode on the quantum dot light emitting layer.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
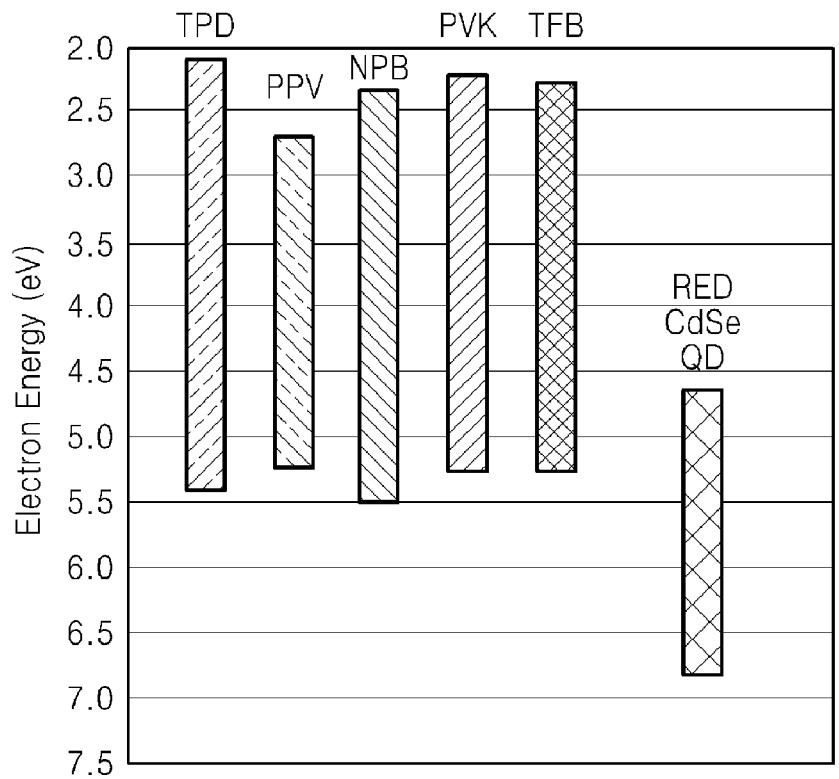
FIG. 1 is a graph for comparing energy band levels of various transport layer materials and a CdSe quantum dot ("QD")

Embodiments now will be described more fully hereinafter with reference to the accompanying drawings, in which embodiments of the invention are shown. The embodiments may, however, be embodied in many different forms and should not be construed as limited to the embodiments set forth herein. Rather, these embodiments are provided so that this disclosure will be thorough and complete, and will fully convey the scope of the embodiments to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting thereof. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the disclosure.

All methods described herein can be performed in a suitable order unless otherwise indicated herein or otherwise clearly contradicted by context. The use of any and all examples, or exemplary language (e.g., "such as"), is intended merely to better illustrate the disclosure and does not pose a limitation on the scope thereof unless otherwise claimed. No language in the specification should be construed as indicating any non-claimed element as essential to the practice of the embodiments as used herein.

Hereinafter, the embodiments will be described in detail with reference to the accompanying drawings.

FIG. 1 is a graph for comparing energy band levels of various transport layer materials and a quantum dot ("QD") including CdSe. Referring to FIG. 1, the energy band level of a II-VI group semiconductor QD, for example, a QD including CdSe, CdTe and/or CdS, is relatively low, unlike other III-V group QD or organic light emitting materials for forming an organic light emitting devices ("OLED").

Referring to FIG. 1, for example, the highest occupied molecular level ("HOMO") energy band level of a general organic polymer light emitting material is about 5.5 eV, whereas the valence band level of CdSe QD (red) is about 6.8 eV. For most organic monomer or polymer hole transport layer materials, for example, N,N'-diphenyl-N,N'-bis(3-methylpenyl)-(1,1'-bipenyl)-4,4'-diamin ("TPD"), N,N'-di (naphthalene-1-yl)-N—N'-diphenyl-benzidine ("NPB"), poly(9,9'-dioctylfluorene-co-N-(4-butylphenyl)diphenylamine) ("TFB"), poly(p-phenylene vinylene) ("PPV"), and poly N-vinyl carbazole ("PVK"), used for OLEDs or QD-LEDs, the HOMO energy band level is about 5.2 eV on average. For an existing OLED, since the light emitting layer is formed of an organic (polymer) material, the HOMO energy band level of the hole transport layer ("HTL") is similar to that of the light emitting layer in the OLED. Thus, in the OLED, hole injection is efficiently performed so that an efficiency of the device may be relatively high.

In contrast, a QD-LED using CdSe QD and having a similar structure to the OLED does not show as high an efficiency value as the OLED. One of the main reasons for efficiency deterioration is a relatively large difference in the energy of a valence band level, that is, a band offset, between an HTL and a QD light emitting layer. As used herein, the band offset signifies an energy band position difference between two layers.

In addition to the deterioration of light emission efficiency, the band offset increases a turn-on voltage of the device utilizing the QD and decreases power efficiency according to an increase in the operating voltage. Thus, the performance of the QD-LED may be improved by reducing the band offset between the QD light emitting layer and the HTL.

Embodiments disclosed herein include configurations wherein the QD-LED includes a QD containing layer in addition to the QD light emitting layer. The QD light emitting layer has an energy band level different from that of the QD light emitting layer and is disposed between a charge transport layer (an HTL or an electron transport layer ("ETL")) and the QD light emitting layer. Specifically, the QD containing layer reduces the energy difference between the QD light emitting layer and the HTL to improve a carrier injection efficiency and optical confinement of the resulting device. In other words, the QD layer may be formed of multiple layers (a QD multilayer).

The QD containing layer may function as a QD light emitting layer as in the embodiments to be described in more detail later, or as a charge transport layer, that is, an HTL or an ETL, or as a carrier confinement layer such as a hole blocking layer ("HBL") or an electron blocking layer ("EBL"). When functioning as a QD light emitting layer or a charge transport layer, only the energy band level of the QD containing layer may be shifted, while the band gap of the QD containing layer may be substantially maintained equal to that of the QD light emitting layer. When functioning as a carrier confinement layer, the QD containing layer may have a band gap that is different, for example, larger, than that of the QD light emitting layer.

The adjustment of the energy band level of the QD layers may be obtained by shifting the energy band level in a surface exchange process of a QD. For example, in one embodiment a surface exchange process of a QD may be altered via surface modification.

As described above, the band offset between the QD light emitting layer and the HTL may be reduced or the injected electrons and holes may be effectively confined in the QD light emitting layer by adding the QD containing layer having an energy band level different from that of the QD light emitting layer to form a QD multilayer. When a QD multilayer is configured to reduce the band offset between the QD light emitting layer and the HTL, the transport of the electrons and holes may be efficiently performed. Accordingly, the carrier injection efficiency and light emitting efficiency of the QD-LED may be improved and the turn-on voltage and operating voltage of the QD-LED may be lowered. When the QD multiplayer is configured to effectively confine the injected electrons and holes in the QD light emitting layer, the optical confinement and the light emitting efficiency of the QD-LED may be improved.

Figure 2:
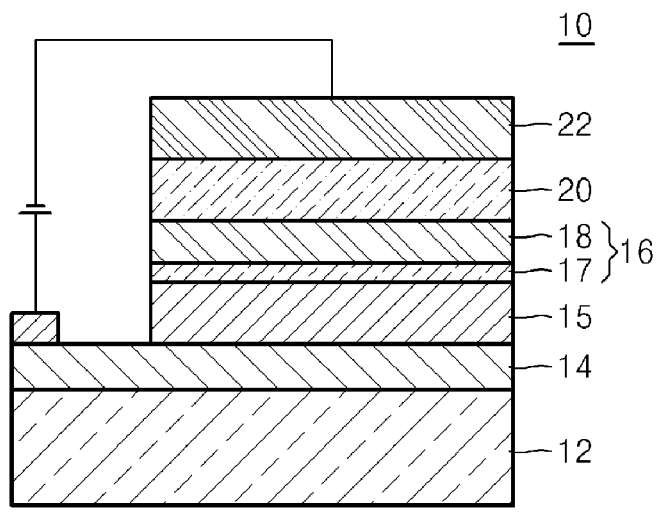
FIG. 2 is a cross-sectional view illustrating an embodiment of a QD light emitting device ("QD-LED")
Figure 3:
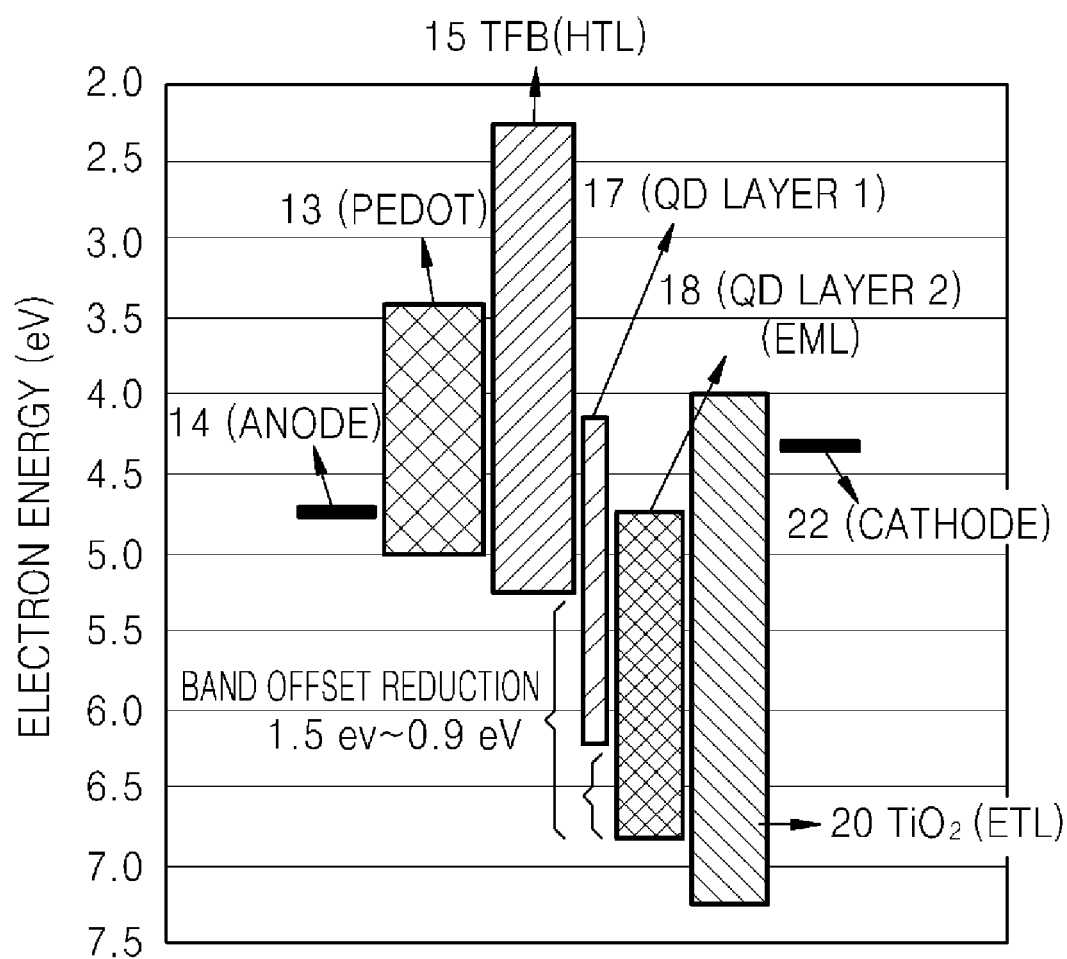
FIG. 3 is a graph schematically showing an example of a band structure of the embodiment of a QD-LED.

FIG. 2 is a cross-sectional view illustrating an embodiment of a QD-LED. FIG. 3 is a graph schematically showing an example of a band structure of the embodiment of a QD-LED. FIG. 3 schematically illustrates the band structure of the embodiment of the QD-LED when a hole injection layer ("HIL") is further included (specifically, the HIL is not illustrated in FIG. 2). FIGS. 2 and 3 illustrate that a QD multilayer is configured to reduce a band offset between a QD light emitting layer and an HTL.

Referring to FIGS. 2 and 3, a QD-LED 10 includes a substrate 12, a QD multilayer 16 having a QD light emitting layer 18 and a QD containing layer 17 which are deposited on and above the substrate 12 and have energy band levels different from each other. The QD-LED 10 also includes a first electrode 14, which may be, for example, an anode electrode, and a second electrode 22, which may be, for example, a cathode electrode, connected to an external power source to inject carriers (charge transport media such as holes and electrons) into the QD light emitting layer 18. The QD-LED 10 also includes a first charge transport layer 15, which may be, for example, an HTL 15, provided between the QD multilayer 16 and the first electrode 14, and a second charge transport layer 20, which may be, for example, an ETL 20, provided between the QD multilayer 16 and the second electrode 22. FIGS. 2 and 3 illustrate an example of a dual layer structure of the QD multilayer 16 including the QD light emitting layer 18 and the QD containing layer 17 arranged between the QD light emitting layer 18 and the HTL 15. In the present embodiment, the energy band level of the QD containing layer 17 is positioned between that of the QD light emitting layer 18 and that of the HTL 15 and functions as a QD light emitting layer with the QD light emitting layer 18, or as an HTL with the HTL 15 or both. Thus, the QD containing layer 17 reduces the band offset between the QD light emitting layer 18 and the HTL 15.

In the present embodiment, transparent glass, a flexible plastic substrate or other materials with similar characteristics may be used as the substrate 12. Embodiments of the plastic substrate may be formed of a resin selected from the group consisting of polyalkylene terephthalate such as polyethylene terephthalate or polybutylene terephthalate, polyalkylene naphthalate such as polyethylene naphthalate, polycarbonate, polyolefin such as polypropylene or polyethylene, polybutene, polybutadiene, polyalkylpentene such as polymethylpentene, polyvinylchloride, triacetylcellulose, polyethersulphone, polyurethane, polyalkylene vinyl acetate such as polyethylene vinyl acetate, ionomer resin, alkylene-(meta) acrylic acid copolymer such as ethylene-(meta)acrylic acid copolymer, alkylene-(meta)acrylic acid ester copolymer such as ethylene-(meta)acrylic acid ester copolymer, polystyrene, polyimide, polyamide, polyamideimide, fluorine resin, a copolymer thereof and a combination thereof, but the embodiments are not limited thereto.

In the present embodiment, the first electrode 14 is used as an anode and may be formed of a material having a high work function to enable injection of holes into the QD-LED. For example, in one embodiment the first electrode 14 may be formed of a transparent oxide, examples of which include indium tin oxide ("ITO"), indium oxide, indium zinc oxide ("IZO") and other materials with similar characteristics. Embodiments include configurations wherein the first electrode 14 may be formed on the substrate 12 in a dry deposition method such as sputtering.

The HTL 15 is provided on the first electrode 14. Embodiments of the HTL 15 may be formed of a p-type semiconductor material or other materials having similar characteristics. For example, embodiments of the HTL 15 may be formed of poly(styrene sulfonate) ("PSS") derivative, poly-N-vinylcarbazole derivative, polyphenylenevinylene derivative, polyparaphenylene derivative, polymethacrylate derivative, [poly (9,9-octylfluorene)] derivative, [poly(spiro-fluorene)] derivative, TPD, NPB, tris(3-methylpenylpenylamino)-triphenylamine ("m-MTDATA"), TFB, poly(9,9-dioctylfluorene)-co-N,N-diphenyl-N,N-di-(p-butylphenyl)-1,4-diaminobenzen ("PFB"), poly-TPD, metal oxides such as NiO or MoO3, and chalcogenide such as MoS3 or CdTe, or other materials with similar characteristics but the embodiments not limited thereto.

The HTL 15 extends the life span, i.e., the total operational period, of the QD-LED 10 and decreases a turn-on voltage, e.g., an operation start voltage, of the QD-LED 10. In particular, the HTL 15 formed of a polymer material such as poly(3,4-Ethylenedioxythiophene); poly(3,4-ethylenedioxythiophene) ("PEDOT"), PSS, PPV, PVK, TFB, PFB, or poly-TPD has a relatively strong resistance to a toxic material such as oxygen or moisture and a high resistance to crystallization, compared to a low molecular weight organic material. Embodiments of the HTL 15 may be formed by a wet coating method such as spin coating. For example, in one embodiment when a PPV polymer film is formed on the first electrode 14, a precursor solution including PPV precursor polymer and a methanol organic solvent is spin coated on the first electrode 14 and undergoes a thermal treatment, for example, for three hours at a curing temperature of 250° C.-300° C. in a $N_2$ inactive gas atmosphere or vacuum atmosphere, thereby obtaining the HTL 15 formed of a PPV thin film.

The QD multilayer 16 may be formed on the HTL 15. Each of the QD containing layer 17 and the QD light emitting layer 18 which together form the QD multilayer 16, is formed of a plurality of QDs that are arranged in a monolayer or a multilayer. As used herein, the term QD refers to a particle of a predetermined size having a quantum confinement effect. Embodiments of the QD may have a diameter of about 1 nm-10 nm.

In the present embodiment, the QD containing layer 17 may be formed to have the same energy band gap as the QD light emitting layer 18 and a different valance band energy band level. As described later, QDs, each having substantially the same size and formed of the same material as that of the QD in the QD light emitting layer 18, are arranged in the QD containing layer 17. The QD containing layer 17 may be formed by further performing a surface exchange process on the QDs contained therein such that the valance band energy band level of the QD containing layer 17 becomes different from that of the QD light emitting layer 18. When the QD containing layer 17 is located between the HTL 15 and the QD light emitting layer 18 as shown in FIGS. 2 and 3, the valance band level of a QD of the QD containing layer 17 is shifted to be between the valance band level of a QD of the QD light emitting layer 18 and the HOMO energy band level of the HTL 15. The QD containing layer 17 functions, for example, as a second HTL or a second QD light emitting layer or both. Significantly, since the effective band offset between the HTL 15 and the QD light emitting layer 18 is reduced, the carrier injection efficiency and the light emission efficiency of the QD-LED 10 may be improved. Also, the turn-on voltage or the operating voltage of the QD-LED 10 may be reduced.

In one embodiment, the QDs arranged in the QD containing layer 17 and the QD light emitting layer 18 may be synthesized by a wet chemical process, an organic metal chemical deposition process, a molecular beam epitaxy ("MBE") process or other similar processes. The wet chemical process is a method of growing particles by putting a precursor material in an organic solvent. When crystallization develops, the organic solvent is naturally coordinated at a surface of a QD crystal to function as a dispersing agent, thereby controlling the development of crystallization. Thus, the growth of a nano particle may be controlled by a process that is easier and cheaper than a vapour deposition method such as an organic metal chemical deposition ("MOCVD") or even the MBE process. By controlling the size of a QD, the energy band gap may be adjusted so that light of a variety of wavelength bands may be obtained from the QD light emitting layer 18. Thus, using a plurality of different sizes of QD may result in a display which emits light at a plurality of wavelengths. The sizes of QDs may be chosen so that red, green and blue light is emitted, thus resulting in a color display, or the various color lights may be combined to emit white light.

In detail, embodiments of the QD may be formed of a semiconductor material selected from the group consisting of a II-VI group semiconductor compound, a III-V group semiconductor compound, a IV-VI group semiconductor compound, a IV group element or compound and a combination thereof.

Embodiments of the II-VI group semiconductor compound may be selected from the group consisting of a binary compound selected from the group consisting of CdSe, CdTe, ZnS, ZnSe, ZnTe, ZnO, HgS, HgSe, HgTe and a combination thereof; a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe and a combination thereof; and a quaternary compound selected from the group consisting of CdZnSeS, CdZnSeTe, CdZnSTe, CdHgSeS, CdHgSeTe, CdHgSTe, HgZnSeS, HgZnSeTe, HgZnSTe and a combination thereof.

Embodiments of the III-V group semiconductor compound may be selected from the group consisting of a binary compound selected from the group consisting of GaN, GaP, GaAs, GaSb, AlN, AlP, AlAs, AlSb, InN, InP, InAs, InSb and a combination thereof; a ternary compound selected from the group consisting of GaNP, GaNAs, GaNSb, GaPAs, GaPSb, AlNP, AlNAs, AlNSb, AlPAs, AlPSb, InNP, InNAs, InNSb, InPAs, InPSb, GaAlNP and a combination thereof; and a quaternary compound selected from the group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and a combination thereof.

Embodiments of the IV-VI group semiconductor compound may be selected from the group consisting of a binary compound selected from the group consisting of SnS, SnSe, SnTe, PbS, PbSe, PbTe and a combination thereof; a ternary compound selected from the group consisting of SnSeS, SnSeTe, SnSTe, PbSeS, PbSeTe, PbSTe, SnPbS, SnPbSe, SnPbTe and a combination thereof; and a quaternary compound selected from the group consisting of SnPbSSe, SnPbSeTe, SnPbSTe and a combination thereof.

Embodiments of the IV group element or compound may be selected from the group consisting of an element compound selected from the group consisting of Si, Ge, and a combination thereof and a binary compound selected from the group consisting of SiC, SiGe, and a combination thereof.

Embodiments of the QD may have a homogeneous single structure or a core-shell dual structure where the core and shell may include different materials. In the latter embodiments, a material forming each of the core and the shell may be at least one of the above-described different semiconductor compounds. However, the energy band gap of the shell material may be larger than that of the core material. For example, in an embodiment wherein a QD having a core-shell structure of CdSe/ZnS (wherein the core is made of CdSe and the shell is made of ZnS) is to be obtained, a crystal is formed by injecting a precursor material corresponding to a core, i.e., the CdSe, such as (CH3)2Cd(dimethyl cadmium), trioctylphosphine selenide ("TOPSe") in an organic solvent using trioctylphosphine oxide ("TOPO") as a surfactant. The crystal is maintained for a number of predetermined hours at high temperature to grow to a predetermined size. Then, a precursor material corresponding to a shell (ZnS) is injected on the crystal so that a shell is formed on a surface of the generated core. Thus, a QD of CdSe/ZnS capped by TOPO may be obtained.

Figure 4A:
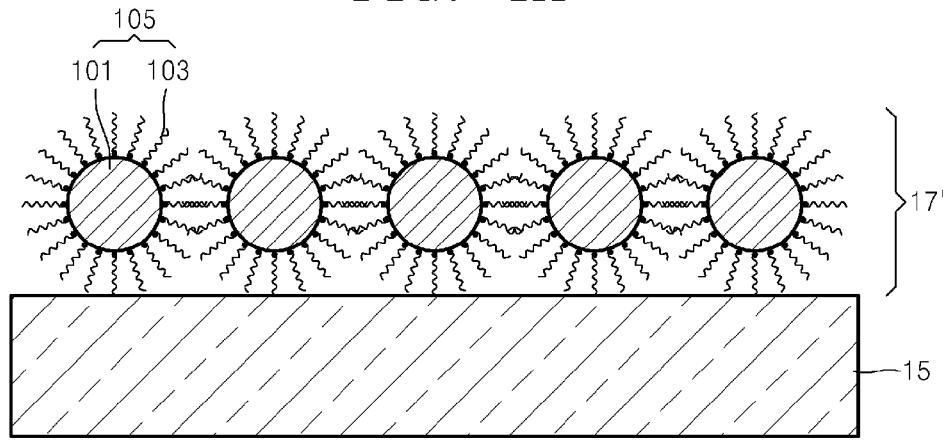
FIGS. 4A-C schematically illustrate an embodiment of a process of manufacturing the QD containing layer and the QD light emitting layer of FIG. 2.
Figure 4B:
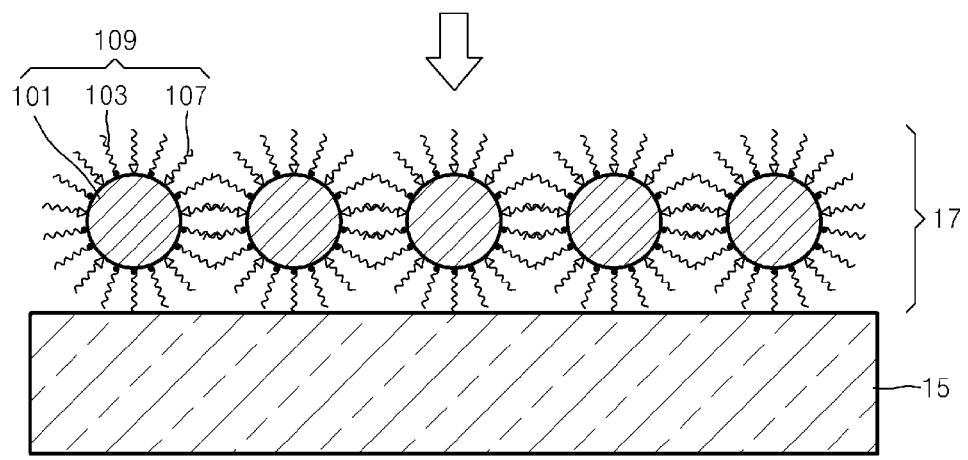
Figure 4C:
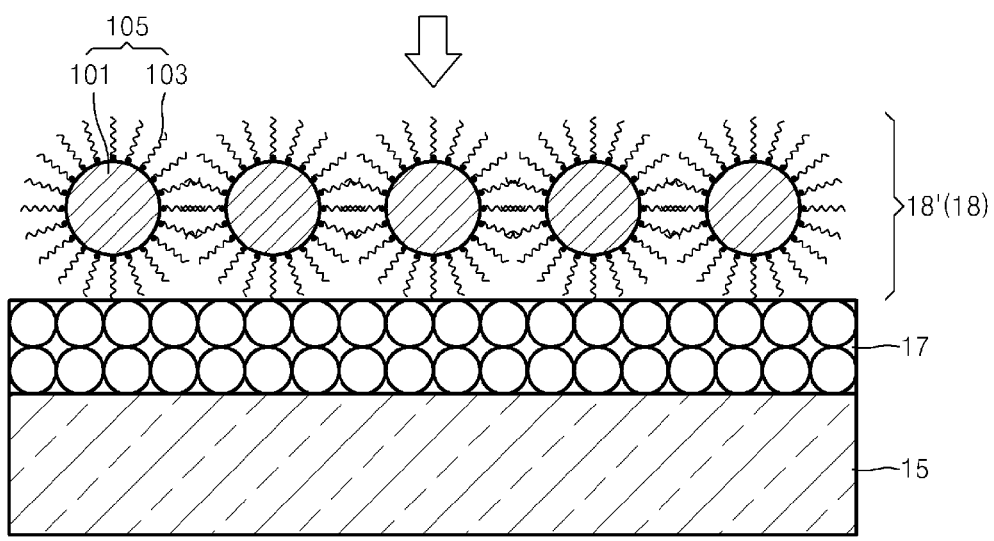

The energy band level of the QD may be changed by performing surface modification after coating a QD coating layer as illustrated in FIGS. 4A-C. FIGS. 4A-C schematically illustrates a process of manufacturing the QD containing layer 17 and the QD light emitting layer 18 of FIG. 2. In FIG. 4A, a surface modification after coating a QD coating layer is illustrated as an example of a surface exchange process for changing the energy band level of a QD.

Referring to FIG. 4A, a QD coating layer 17' is formed to form the QD containing layer 17 having an energy band level different from that of the QD light emitting layer 18. The QD coating layer 17' is formed of an array of QDs 105 that each include a QD core 101 and a first organic ligand 103 existing on the surface of the QD core 101. Embodiments of the QD coating layer 17' may be formed by a wet process such as spin coating, dip coating, printing, spray coating a colloid solution including the QD and other similar methods. Next, the QD coating layer 17' undergoes surface modification to form the QD containing layer 17 including a QD 109 including a second organic ligand 107 in addition to the first organic ligand 103. As illustrated in FIGS. 4A-C, the first organic ligand 103 is illustrated as having a rounded head connecting to the QD core while the second organic ligand 107 is illustrate as having a triangular head connecting to the QD core; this distinction is for purposes of illustration only, and the first organic ligand 103 and the second organic ligand 107 may have various shapes. As shown in FIG. 4C, a QD coating layer 18' is then formed on the QD containing layer 17. Embodiments of the QD coating layer 18' may be formed by a wet process such as spin coating, dip coating, printing, spray coating of a colloid solution including the QD and various other similar methods, as in the formation of the QD coating layer 17'. The QD coating layer 18' may be formed of an array of the QD 105 including the first organic ligand 103 existing on the surface of the QD core 101. The QD coating layer 18' becomes the QD light emitting layer 18. As illustrated in FIG. 4C, the sizes of the QDs of the QD containing layer 17 and the QD coating layer 18' are different, however such size difference is for clarity of illustration only; while embodiments include configurations wherein the sizes of the QDs may be different, the QDs of the different layers in the present embodiment are substantially the same, e.g., they utilize a similar QD core 101 and a similar first organic ligand 103.

FIG. 4C illustrates an example of forming the QD light emitting layer 18 without the surface modification of the QD. Alternative embodiments include configurations wherein the QD light emitting layer 18 may be formed by performing the surface modification on the QD coating layer 18'. In such an embodiment, the QD coating layer 18' may undergo the surface modification using substantially the same process as the one described above for forming the QD coating layer 17'. However, in all embodiments the valance band levels of the QDs of the QD containing layer and the QDs of the QD light emitting layer 18 be different from each other. The difference in the valance band level may be obtained from a difference in the distribution of an organic ligand of an asymmetric structure that will be described in more detail later.

Embodiments include configurations wherein the colloid solution including the QD may be obtained by mixing an organic solvent, a first surfactant and a cation precursor and heating and maintaining the mixture at a reaction temperature while injecting an anion precursor in the mixture. However, the colloid solution including the QD may be prepared in other ways too. In the embodiments wherein it is used, the first surfactant may form the first organic ligand 103 of the QD coating layer 17' and the QD coating layer 18'.

Embodiments of the organic solvent may be primary alkyl amine having a carbon number of 6-22, secondary alkyl amine having a carbon number of 6-22, tertiary alkyl amine having a carbon number of 6-22, primary alcohol having a carbon number of 6-22, secondary alcohol having a carbon number of 6-22, tertiary alcohol having a carbon number of 6-22, ketone and ester having a carbon number of 6-22, a heterocyclic compound including nitrogen or sulfur having a carbon number of 6-22, alkane having a carbon number of 6-22, alkene having a carbon number of 6-22, alkyne having a carbon number of 6-22, trialkylphosphine such as trioctylphosphine, trialkylphosphine oxide such as trioctylphosphine oxide or other materials having similar characteristics.

A compound expressed by Chemical Formula 1 may be used as the first surfactant.

X—R <Chemical Formula 1>

In Chemical Formula 1, "X" is a functional group including at least one selected from the group consisting of a functional group including elements of N, O, P, F, Cl or S and an acid group. Embodiments of "X" may include, for example, N, NO, $NO_2$, NH, $NH_2$, $NH_3$, COOH, CO, $CO_2$, P, POOH, P=O, $PO_2$, $PO_3$, S, SOOH, SH, SO, $SO_2$, $SO_3$, CN, F or Cl. "R" is a carbon-hydrogen group, for example, substituted or non-substituted alkyl having a carbon number of 3-20 or substituted or non-substituted aryl having a carbon number of 6-30. The substituted alkyl or aryl may be alkyl or aryl substituted with a substitution group selected from the group consisting of alkyl, aryl and halogen.

The cation precursor may be a precursor of a II-group element such as Zn, Cd or Hg, a precursor of a III-group element such as Al, Ga, In or Ti, a precursor of a IV-group element such as Si, Ge, Sn, or Pb or other materials with similar characteristics. The anion precursor may be a precursor of a V-group element such as P, As, Sb or Bi, a precursor of a VI-group element such as O, S, Se or Te or other materials with similar characteristics. In addition, the cation precursor or the anion precursor may be selectively used according to the constituent element forming the QD, i.e., the QD core 101.

Embodiments include configurations wherein carboxylate, carbonate, halide, nitrate, phosphate, or a sulfate of each element may be used as the precursor.

The colloid solution including the QD is coated on the HTL 15 to form the QD coating layer 17'. Similarly, the colloid solution including the QD is coated on the QD containing layer 17 to form the QD coating layer 18'. The QD coating layer 17' or 18' includes the QD core 101 and the first organic ligand 103 distributed on the surface of the QD core 101. The first organic ligand 103 is driven from the first surfactant used for the synthesis of the QD.

The QD containing layer 17 may be formed by applying a surface modification composite including a second surfactant to the QD coating layer 17'. The second surfactant forms the second organic ligand 107 on the surface of the QD core 101 thereby differentiating the QD 109 from the QD 105.

In the surface modification composite, the concentration of the second surfactant may be, for example, about 5 mM to about 100 mM. Embodiments of the surface modification composite may be manufactured by distributing the second surfactant in an appropriate solvent which may be an alcohol solvent such as methanol, ethanol, isopropyl alcohol or other solvent with similar characteristics. Any solvent capable of distributing the secondly surfactant only may be used. Also, since the solvent capable of dissolving the QD is not necessary, a wide variety of solvents may be used so that a variety of second surfactants may also be used.

Embodiments of the coating method of the surface modification composite may include dip coating, spin coating, printing, spray coating, and other similar methods, but embodiments thereof are not limited thereto. For the dip coating, the surface modification composite may be dipped, for example, for about 30 seconds to about 24 hours and the temperature of the surface modification composite may be, for example, from room temperature to about 70° C. For the spin coating, while a sample to be coated is rotated, for example, at between about 300 rpm to about 5000 rpm, the surface modification composite is coated, for example, for about 15 seconds to about 2 minutes. The spin coating may be performed repeatedly from about 1 to about 20 times. For the spray coating, the temperature of the sample to be coated may be adjusted, for example, from about 0° C. to about 200° C. and the spray coating is performed for about 5 seconds to about 2 hours. After the coating, the sample may be cleaned with alcohol to remove impurities.

The second surfactant to introduce the second organic ligand 107 may be expressed by Chemical Formula 2.

X'—R' <Chemical Formula 2>

In Chemical Formula 2, "X'" is a functional group including at least one selected from the group consisting of an electron withdrawing group having a large electronegativity including an element such as N, O, P, F, Cl, or S, and an acid group. Embodiments of "X'" may include, for example, N, NO, $NO_2$, NH, $NH_2$, $NH_3$, COOH, CO, $CO_2$, P, POOH, P=O, $PO_2$, $PO_3$, S, SOOH, SH, SO, $SO_2$, $SO_3$, CN, F, Cl or other materials with similar characteristics. However, "X'" may be different from the "X" of the first surfactant of Chemical Formula 1 that provides the first organic ligand to the QD, and may also have a large electronegativity.

"R'" is a carbon-hydrogen group, for example, substituted or non-substituted alkyl having a carbon number of 3-20 or substituted or non-substituted aryl having a carbon number of 6-30 or other materials having similar characteristics. The substituted alkyl or aryl may be alkyl or aryl substituted with a substitution group selected from the group consisting of alkyl, aryl, and halogen.

Embodiments of the second surfactant expressed by Chemical Formula 2 may be oleic acid, stearic acid, palmitic acid, hexyl phosphonic acid, n-octyl phosphonic acid, tetradecyl phosphonic acid, octadecyl phosphonic acid, n-octylamine, hexadecyl amine, alkylamin such as heptyl amine, alkanethiol such as octanthiol or other materials having similar characteristics.

Another second surfactant of Chemical Formula 3 further including a "Y" group formed of a functional group different from the "X" at an end of "R'" of Chemical Formula 2.

X'—R'—Y <Chemical Formula 3>

In Chemical Formula 3, "X'" and "R'" may be the same as those of Chemical Formula 2. "Y" is a functional group including at least one selected from the group consisting of an electron withdrawing group having a large electronegativity including an element such as N, O, P, F, Cl or S, and an acid group. Embodiments of "X'" may be, for example, N, NO, $NO_2$, NH, $NH_2$, $NH_3$, COOH, CO, $CO_2$, P, POOH, P=O, $PO_2$, $PO_3$, S, SOOH, SH, SO, $SO_2$, $SO_3$, CN, F, or Cl. However, "X'" and "Y" may be different from the "X" of the first surfactant of Chemical Formula 1 that provides the first organic ligand to the QD and have a large electronegativity. In the present embodiment, "X'" and "Y" are different from each other.

The second surfactant expressed by Chemical Formulas 2 and 3 substitutes at least part of the first organic ligand 103 to modify the surface of the QD 105 to form the QD 109. Since the surface modification is performed using the second surfactant after the QD coating layer 17' is formed, a first surface contacting the HTL 15 and a second surface contacting the QD light emitting layer 18 after the subsequent process is performed are under different surface modification environments. Specifically, the surface contacting the HTL 15 (or the anode 14 in embodiments where the HTL 15 is omitted) is less exposed to the surface modification treatment since it is blocked on that side by the underlying surface. Thus, since the second surface which does not contact the underlying layer is more exposed to the second surfactant, the first organic ligand 103 is substituted at a higher degree with the second organic ligand 107 in the second surface so that the QD 109 having a different organic ligand distribution may be formed. In other words, in the subsequent process, the second surface contacting the QD light emitting layer 18 includes the QD 109 having a relatively large number of the second organic ligand 107, compared to the first surface contacting the HTL 15. Thus, the organic ligand distribution has an asymmetric structure. In detail, the distribution of the second organic ligand 107 may decrease from the second surface, which does not contact the underlying layer, to the first surface, which does contact the underlying layer or is in proximity thereto.

"X'" and "Y", which are the electron withdrawing groups having a large electronegativity, they are disposed in the second surfactant, are expressed by Chemical Formula 2 or 3 and are located at the surface of the QD core 101 of the QD containing layer 17 and influence the electron density distribution of the QD containing layer 17 so that the valance band level of the QD containing layer 17 may be changed. Also, "X" and "Y" may induce the polarity of the QD containing layer 17 to lower an energy barrier at a boundary surface where the QD containing layer 17 contacts the HTL 15 or the QD light emitting layer 18, so that the transfer of carriers may be facilitated. When the surface modification is performed using the second surfactant of Chemical Formula 3 having different ligands at both ends thereof, the polarity induction may be greatly enhanced.

After the QD containing layer 17 having an organic ligand distribution of the above-described asymmetrical structure is formed, the QD light emitting layer 18 is formed. When the surface modification is not applied, the QD light emitting layer 18 has an organic ligand distribution with a substantially symmetric structure. That is, as illustrated in FIG. 4C, the QD 105 arranged in the QD light emitting layer 18 may have a structure in which the first organic ligand 103 symmetrically exists on the surface of the QD core 101.

As illustrated in FIG. 3, the energy band level of the QD containing layer 17 in which the QD 109 having an organic ligand distribution having an asymmetric structure is arranged may be shifted toward the energy band level of the HTL 15, compared to the QD light emitting layer 18 in which the QD 105 having an organic ligand distribution having a symmetric structure. The asymmetric distribution of the organic ligand shifts the energy band level of the QD 109 to compensate for the band offset between the valence band level of the QD light emitting layer 18 and the HOMO level of the HTL 15, a carrier injection efficiency may be improved, the turn-on voltage and the operating voltage may be reduced, and a QD-LED having a high light emitting efficiency may be realized.

The QD 109 arranged in the QD containing layer 17 includes the QD core 101 and the first and second organic ligands 103 and 107 which are distributed on the surface of the QD core 101. The first and second surfaces of the QD containing layer 17 respectively contacting the HTL 15 and the QD light emitting layer 18 have different organic ligand distributions as discussed above. In the QD containing layer 17, the electronegativity of the second surface contacting the QD light emitting layer 18 is formed to be higher than that of the first surface contacting the HTL 15. The difference in the electronegativity may be, for example, within a range of about 0.1 to about 3.7. By adjusting the difference in the electronegativity between the first surface contacting the HTL 15 and the second surface contacting the QD light emitting layer 18, the amount of shift of the energy band level of the QD containing layer 17 may be adjusted so that the efficiency of a QD-LED may be improved.

Embodiments include configurations wherein the QD containing layer 17 and the QD light emitting layer 18 formed as above are annealed so as to be further stabilized. The annealing process may be preformed, for example, for 5 minutes to about 24 hours at a temperature of about 60° C. to about 240° C. When the QD containing layer 17 having an adjusted energy band level is formed by forming the QD coating layer 17' and performing a surface modification thereon, the QD containing layer 17 may be formed in a simple process in which the QD 109 may not be lost, e.g., it is not dissolved or otherwise deteriorated.

Referring back to FIG. 2, after forming the QD multilayer 16 as described above, the ETL 20 may be formed on the QD light emitting layer 18. A variety of materials may be selected as a material for forming the ETL 20. For example, embodiments of the ETL 20 may include metal oxides such as $TiO_2$, $ZrO_2$, $HfO_2$ or other materials with similar characteristics, inorganic materials including $Si_3N_4$ or other materials with similar characteristics, or an n-type semiconductor polymer may be used for forming the ETL 20. In detail, a material used for forming the ETL 20 may be oxide selected from the group consisting of: $TiO_2$, ZnO, $SiO_2$, $SnO_2$, $WO_3$, $Ta_2O_3$, $BaTiO_3$, $BaZrO_3$, $ZrO_2$, $HfO_2$, $Al_2O_3$, $Y_2O_3$ $ZrSiO_4$ or other materials with similar characteristics, nitrides such as $Si_3N_4$ or other materials with similar characteristics, a semiconductor selected from the group consisting of CdS, ZnSe, ZnS or other materials with similar characteristics; or an electron transport polymer such as (poly-2,7-(9,9'-di-n-octylfluorene-3,6-benzothiadiazole ("$F_8BT$") or other materials with similar characteristics, but the embodiments are not limited thereto.

When the ETL 20 is formed of an inorganic material or polymer material as described above, the deterioration of a QD-LED due to oxidation or corrosion may be structurally prevented. In particular, by using a material having a low threshold voltage close to that of a low molecular weight organic matter, the turn-on voltage of the QD-LED may be maintained as low as that of a typical organic light emitting diode ("OLED"). Embodiments include configurations wherein the ETL 20 may be formed by a dry film formation method including evaporation such as sputtering, a dry film formation method such as plasma plating or ion plating, or a wet film formation method including spin coating, dipping, flow coating and other similar methods.

The second electrode 22 formed on the ETL 20 is used as a cathode and may be formed of a material having a small work function to facilitate injection of electrons into the ETL 20. Embodiments of the second electrode 22 may be formed of, for example, metal such as Mg, Ca, Na, K, Ti, In, Yt, Li, Gd, Al, Ag, Sn, Pb, Cs, Ba, other materials with similar characteristics and a combination thereof, and a multilayer structure material such as LiF/Al, $LiO_2$/Al, LiF/Ca, LiF/Al, $BaF_2$/Ca, or other materials with similar characteristics and a combination thereof, but is not limited thereto. In one embodiment, the second electrode 22 may be formed by a dry deposition method such as sputtering.

A QD-LED according to another embodiment may further include a HIL (not shown) disposed between the first electrode 14 and the HTL 15, or an electron injection layer ("EIL") (not shown) disposed between the second electrode 22 and the ETL 20. Any material exhibiting a superior interface characteristic and capable of easily transferring holes to the HTL 15 may be used for forming the HIL. For example, embodiments of the HIL may be formed of a material including PEDOT. Also, any appropriate material may be used for forming the EIL and LiF is industrially widely used for forming the EIL.

The energy band structure of FIG. 3 shows an embodiment of a QD-LED in which the first electrode (anode) 14 is formed of ITO, the second electrode (cathode) 22 is formed of Al, the HIL 13 is formed of PEDOT, the HTL 15 is formed of TFB, the ETL 20 is formed of $TiO_2$, and the QD containing layer 17 (QD layer 1) having a band level shifted by a surface exchange process is formed between the QD light emitting layer 18 (emitting layer ("EML"), QD layer 2) and the HTL 15. In the present embodiment, a nano particle layer of a CdSe/CdS/ZnS (having a core/shell/shell structure) is used for the QD light emitting layer 18. The same nano particle layer of a CdSe/CdS/ZnS (having a core/shell/shell structure) as that for the QD light emitting layer 18 is coated and surface-processed with 1,7-diaminoheptane such that the band level may be shifted to a vacuum level by about 0.6 eV, and is used as the QD containing layer 17. When the QD-LED is formed to have the band structure shown in FIG. 3, compared to the case when the QD containing layer 17 is not included, the band offset of the QD-LED having the band structure shown in FIG. 3 may be reduced, for example, from about 1.5 eV to about 0.9 eV, e.g., a difference of about 0.6 eV or about 40%.

Figure 5:
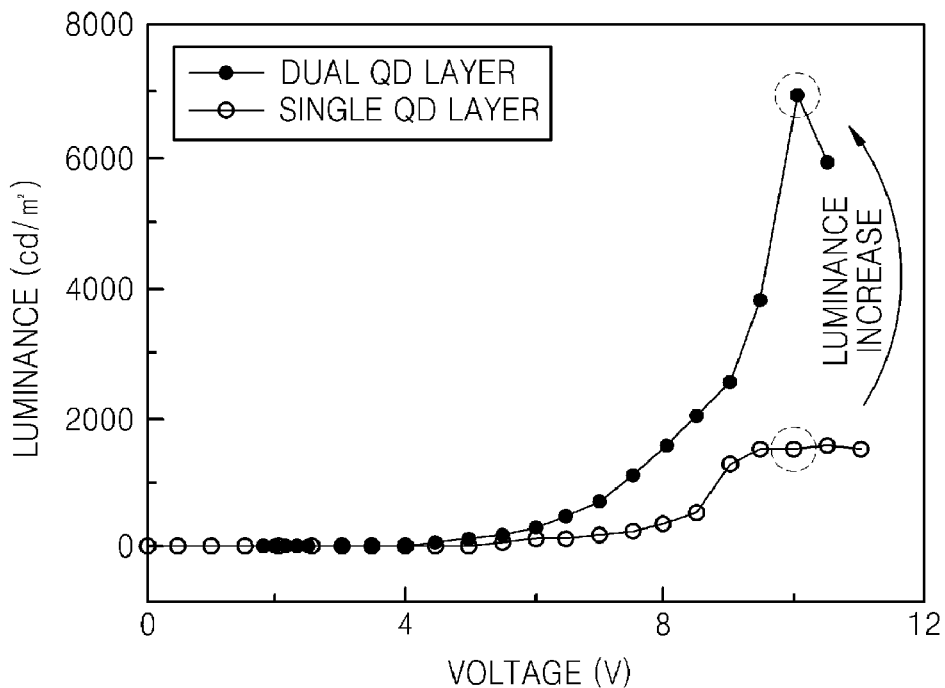
FIGS. 5 and 6 are graphs for respectively comparing the characteristics of luminance and luminous efficiency of a dual QD layer formed including the QD containing layer and the QD light emitting layer and a single QD layer formed of a QD light emitting layer only.
Figure 6:
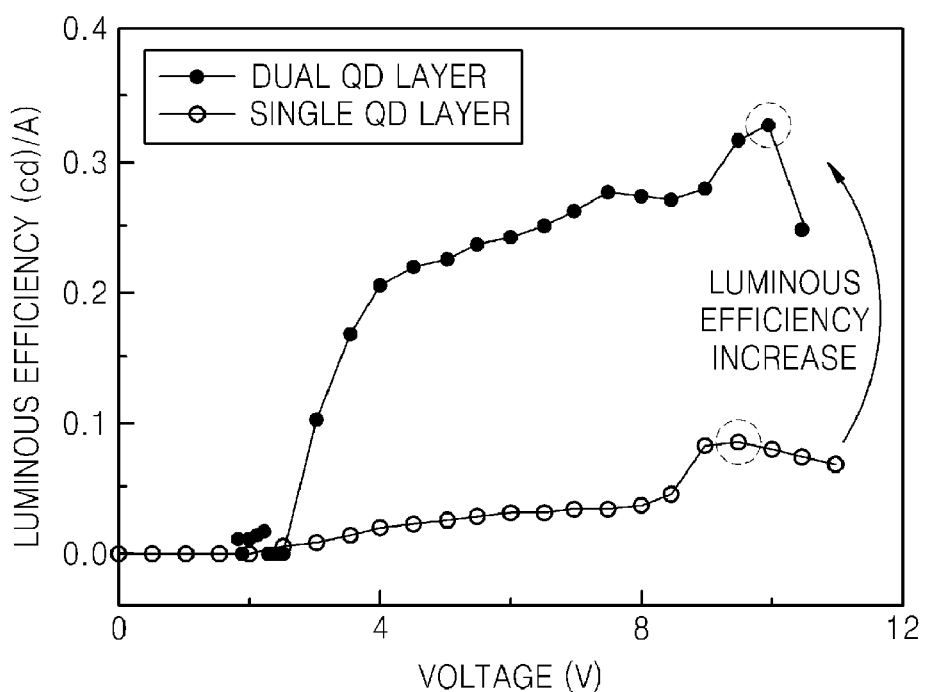

FIGS. 5 and 6, respectively, show the luminance and luminous efficiency of an embodiment of a dual QD layer including the QD containing layer 17 and the QD light emitting layer 18 having the energy band structure of FIG. 3, the QD containing layer 17 having a thickness of about 15 nm and the QD light emitting layer 18 having a thickness of about 30 nm, compared to the comparative case of a single QD layer including only the QD light emitting layer 18 having a thickness of about 30 nm.

As illustrated in FIGS. 5 and 6, for a dual QD layer including the QD containing layer 17 and the QD light emitting layer 18, the luminance may be increased by about 4 times and the luminous efficiency by about 3 times at particular voltages and peak efficiencies, compared to the case when only the QD light emitting layer 18 is used. Another way of interpreting the graphs of FIGS. 5 and 6 is that the same luminosity may be reached in the dual layered QD-LED as in the single layered QD-LED at a much lower voltage.

Table 1 shows measurement results of an ionization potential by He II UV ultraviolet photoelectron spectroscopy ("UPS") with respect to a QD layer before surface modification (as-coated: f1), a QD layer annealed without surface modification (Spin/anneal: f2), a QD layer after surface modification (Spin/cross-link: f3), a QD layer annealed at 80° C. after surface modification (Spin/cross-link/anneal@80° C.: f4) and a QD layer annealed at 180° C. after surface modification (Spin/cross-link/anneal@180° C.: f5) which are formed on a silicon substrate.

TABLE 1

| QD Layer | Secondary Cutoff (eV) | Valence Band Edge (eV) | Ionization Potential (eV) |
|---|---|---|---|
| f1 | 36.59 | 2.63 | 6.85 |
| f2 | 36.67 | 2.70 | 6.84 |
| f3 | 35.77 | 1.21 | 6.25 |
| f4 | 35.90 | 1.33 | 6.23 |
| f5 | 35.55 | 1.02 | 6.29 |

As shown in Table 1, the ionization potential of surface-modified QD layers f3, f4, and f5 is shifted by about 0.6 eV, compared to non-surface modified QD layers f1 and f2.

Figure 7A:
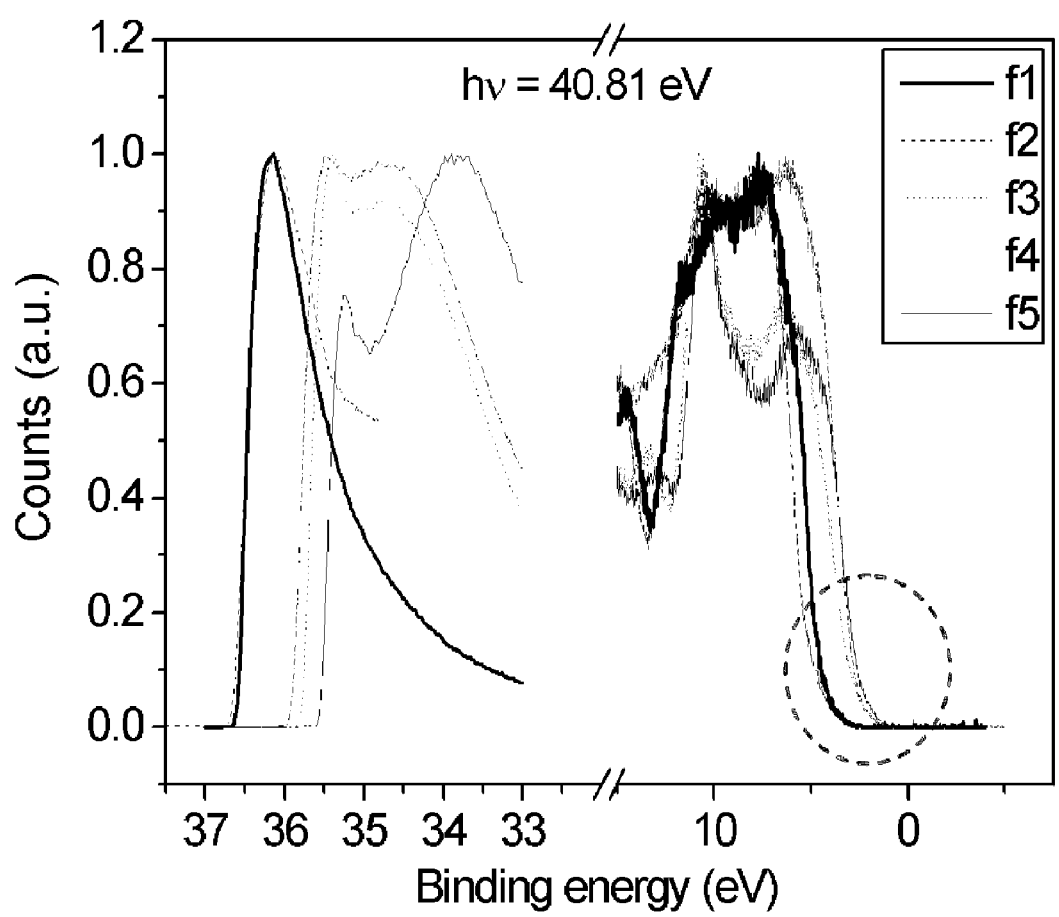
FIG. 7A is a graph showing the He II UPS spectrum of an embodiment of a QD layer that is spin coated on a silicon substrate and thermally or chemically processed.
Figure 7B:
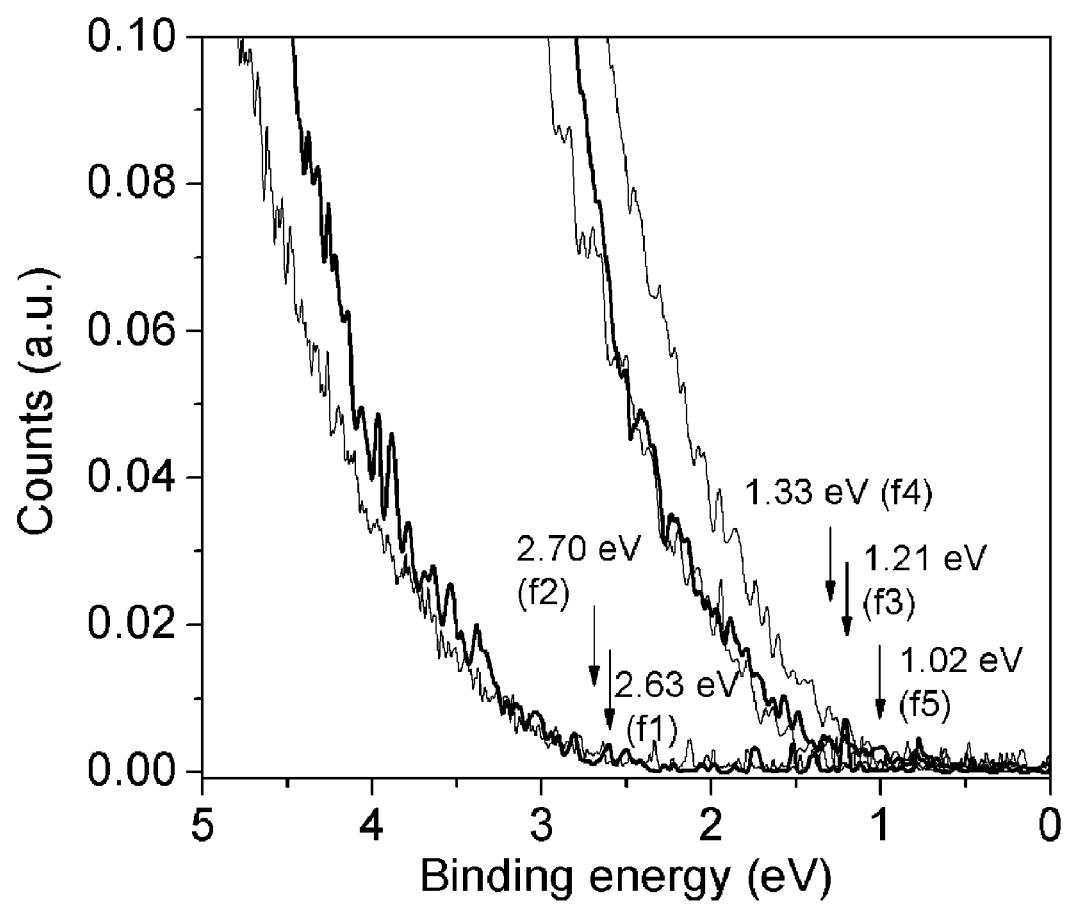
FIG. 7B is an enlarged graph showing a valence band edge area indicated by a dotted circle of FIG. 7A.

FIG. 7A is a graph showing a He II UPS spectrum of a QD layer that is spin coated on a silicon substrate and thermally or chemically processed. FIG. 7B is an enlarged graph showing a valence band edge area indicated by a dotted circle of FIG. 7A. The change in the HOMO level after surface exchange of the QD may be seen from a change in the ionization potential of Table 1 and FIG. 7B.

The results of Table 1, FIG. 7A, and FIG. 7B are obtained when the QD is surface-processed with 1,7-diaminoheptane. It can be seen from the UPS measurement that the band level of the QD after the QD surface process is shifted toward the vacuum level by about 0.6 eV. Shifting of the band level after the surface process of the QD occurs when the QD is surface modified to an amine group, but does not occur when only the annealing process is applied.

Figure 8:
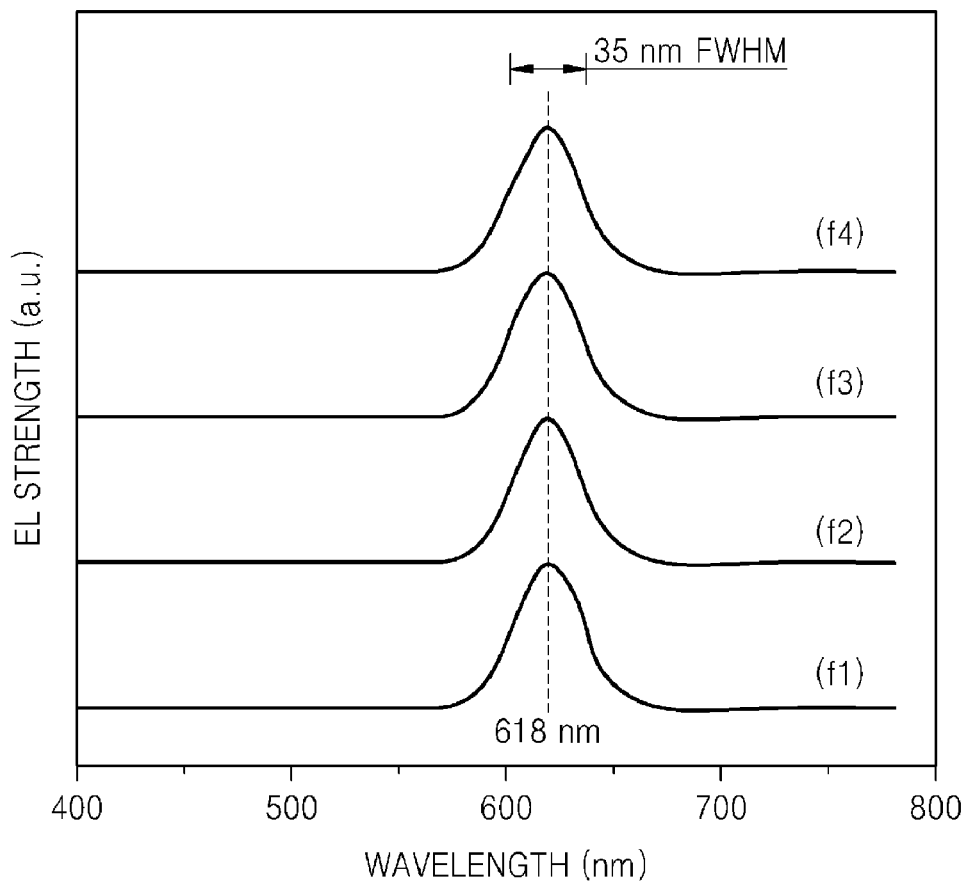
FIG. 8 is a graph showing measurement results of the electroluminescence ("EL") strength of a QD layer formed on the silicon substrate.

FIG. 8 is a graph showing the measurement results of the electroluminescence ("EL") strength of a QD layer before surface modification (As-coated: f1), a QD layer annealed without surface modification (Spin/anneal: f2), a QD layer after surface modification (Spin/cross-link: f3), a QD layer annealed at 80° C. after surface modification (Spin/cross-link/anneal@80° C.: f4), which are formed on a silicon substrate. Referring to FIG. 8, the EL peak position for the above four QD layers is about 618 nm and full width at half maximum ("FWHM") is about 35 nm. Accordingly, it can be seen that the peak position of the EL strength is not changed owing to the surface modification and the annealing process. That is, it can be seen that the band gap of the QD is not changed by the surface modification and the annealing process.

It can be seen from the results of Table 1, FIG. 7A, FIG. 7B, and FIG. 8 that the energy band level itself may be shifted without a change in the band gap through the QD surface processing treatment. Thus, for example, a QD-LED having the band structure and energy band level of FIG. 3 may be manufactured by forming the QD containing layer 17 having a thickness of about 15 nm through the surface processing treatment, forming the QD light emitting layer 18 having a thickness of about 30 nm by spin coating on the QD containing layer 17, and performing an annealing process. The valence band level of the QD containing layer (QD layer 1) having a surface-processed QD is about 6.2 eV, showing a difference of about 0.6 eV from the valence band level of the QD light emitting layer (EML, QD layer 2). It can be seen that the energy band levels of the QD light emitting layer, the QD containing layer, and the HTL are arranged to each be sequentially higher than the preceding layer. As illustrated in FIG. 5, when the QD-LED using the surface-processed QD containing layer as an additional HTL and the QD-LED using an HTL formed of TFB without an additional HTL or QD containing layer are compared with each other, the QD-LED in which holes are transferred to the QD light emitting layer from the HTL formed of TFB without an additional HTL or QD containing layer has the maximum luminance of about 1500 cd/$m^2$ while the maximum luminance of the QD-LED in which the QD containing layer having a surface-processed QD is inserted as an additional HTL is about 7000 cd/$m^2$, which shows an improved performance.

In the above description, the first electrode (anode), the HTL, the QD multilayer, the ETL, and the second electrode (cathode) are sequentially stacked on the substrate, but the description is not limited thereto. In another embodiment of a QD-LED, the second electrode (cathode), the ETL, the QD multilayer, the HTL, and the first electrode (anode) may be sequentially stacked on the substrate, e.g., the order may be reversed. In such an alternative embodiment, when the QD multilayer is, for example, a dual QD layer, the QD light emitting layer, the QD containing layer, and the HTL may be sequentially formed on and above the ETL. A description about a method of manufacturing this alternative stack structure will be omitted herein because the manufacturing method may be sufficiently understood from the above description.

In the QD-LED of FIG. 2, the HTL 15 or the ETL 20 may include a QD similar to the QD multilayer 16. When the HTL 15 and the ETL 20 are configured to include a QD, since the energy band levels of the HTL 15 and the ETL 20 are adjustable, the energy band levels of the HTL 15 or the ETL 20 may be harmonized with that of the QD light emitting layer 18 so that an effective charge transport may be possible. Also, the HTL 15 or the ETL 20 generally has a thick thickness of about 20 nm or more. In such an embodiment, when a value and a property related to the charge transport in a thin film (charge concentration and mobility) value is adjusted by including a QD, an effective charge transport or injection may be possible.

In the above description, the QD multilayer is a dual layer structure including the QD containing layer and the QD light emitting layer, the band gap between the QD containing layer and the QD light emitting layer is the same but the energy band level of the QD containing layer is different from the QD light emitting layer, but other embodiments are possible as described below.

Figure 9:
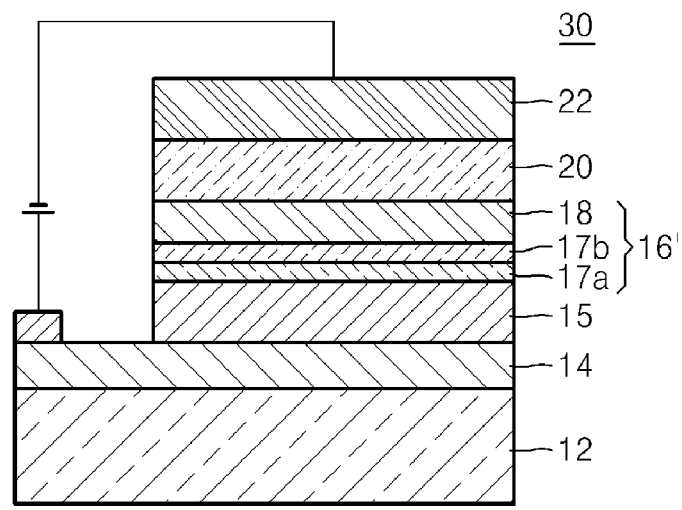
FIG. 9 is a cross-sectional view schematically illustrating another embodiment of a QD-LED.
Figure 10:
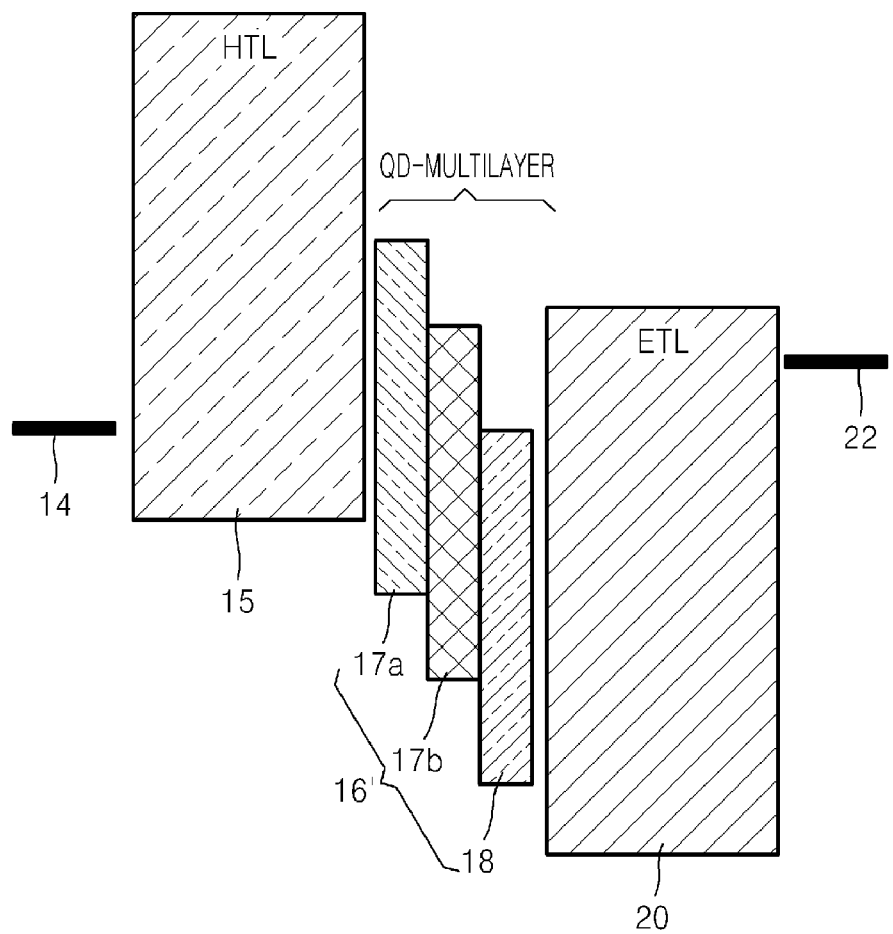
FIG. 10 schematically illustrates a band structure of the embodiment of a QD-LED of FIG. 9.

FIG. 9 is a cross-sectional view schematically illustrating another embodiment of a QD-LED 30 having a QD multilayer having a trilayer structure. FIG. 10 schematically illustrates an exemplary band structure of the QD-LED 30 of FIG. 9. Like reference numerals in the above-described embodiment denote substantially the same elements as in the previous embodiments so that descriptions of the same elements will be omitted herein.

In comparison with FIGS. 2 and 9, the QD-LED 30 includes first and second QD containing layers 17a and 17b instead of the single QD containing layer 17 of the QD-LED 10 of FIG. 2.

Referring to FIGS. 9 and 10, in the present embodiment, a QD multilayer 16' may have a trilayer structure of the first and second QD containing layers 17a and 17b and the QD light emitting layer 18. The first QD containing layer 17a, the second QD containing layer 17b and the QD light emitting layer 18 may be sequentially stacked on and above the HTL 15. Since the materials for forming the first and second QD containing layers 17a and 17b and a method of manufacturing the stack of the first QD containing layer 17a, the second QD containing layer 17b, and the QD light emitting layer 18 may be sufficiently understood from the above descriptions about the QD-LED 10 of FIG. 2, descriptions about the materials and the manufacturing method will be omitted herein.

As illustrated in FIG. 10, the QD multilayer 16 is configured such that the energy band levels of the QD light emitting layer 18, the second QD containing layer 17b, and the first QD containing layer 17a may be sequentially formed in a step energy arrangement, e.g., starting with the QD light emitting layer 18, each layer increases an energy band level in the direction toward the HTL. Accordingly, an effective band offset between the HTL 15 and the QD light emitting layer 18 may be substantially reduced.

In the QD-LED described with reference to FIGS. 2-10, the effective band offset between the HTL and the QD light emitting layer is reduced by configuring at least one QD containing layer and the QD light emitting layer, which together form a QD multilayer, to have the same band gap and different energy band level positions. However, alternative embodiments include configurations wherein the at least one QD containing layer and the QD light emitting layer may be configured to have different band gaps from each other.

Figure 11:
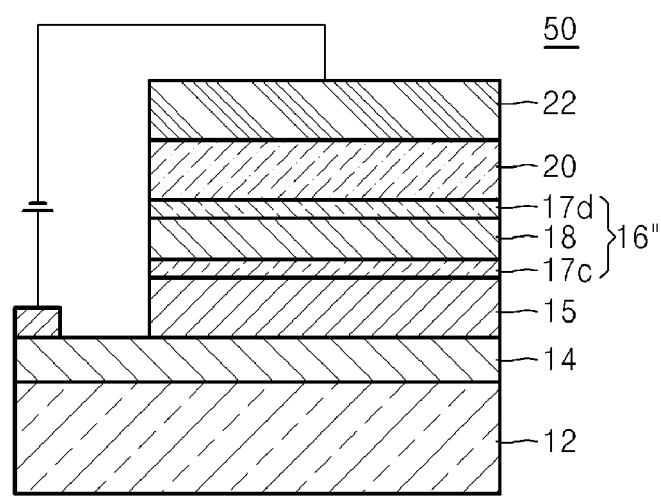
FIG. 11 a cross-sectional view schematically illustrating another embodiment of a QD-LED.
Figure 12:
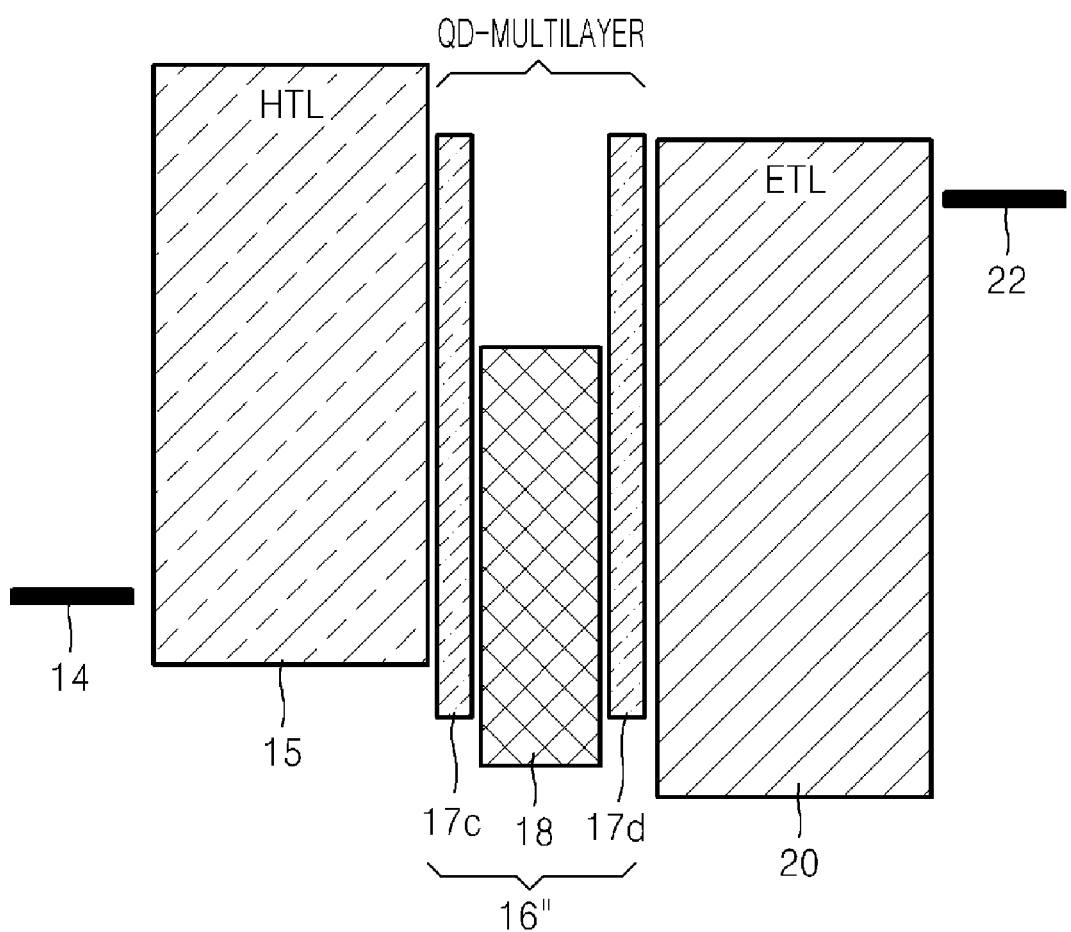
FIG. 12 schematically illustrates a band structure of the embodiment of a QD-LED of FIG. 11.

FIG. 11 a cross-sectional view schematically illustrating another embodiment of a QD-LED 50 having a QD multilayer, in which QD containing layers 17c and 17d are respectively positioned at either side of the QD light emitting layer and band gaps of the QD containing layers 17c and 17d are different from the band gap of the QD light emitting layer. FIG. 12 schematically illustrates a band structure of the QD-LED 50 of FIG. 11. Like reference numerals in the above-described embodiment denote substantially the same elements so that descriptions of the same elements will be omitted herein.

In comparison with FIGS. 9 and 11, the QD-LED 50 includes first and second QD containing layers 17c and 17d respectively positioned at either side of the QD light emitting layer 18 in FIG. 11, whereas the first and second QD containing layers 17a and 17b are positioned at one side, e.g., a same side, of the QD light emitting layer 18 in the QD-LED 30 of FIG. 9.

Referring to FIGS. 11 and 12, in the present embodiment, a QD multilayer 16" may have a trilayer structure including the QD light emitting layer 18 and the first and second QD containing layers 17c and 17d respectively positioned at either side of the QD light emitting layer 18. The first QD containing layer 17c, the QD light emitting layer 18, and the second QD containing layer 17d may be sequentially stacked on and above the HTL 15. Since the materials for forming the first and second QD containing layers 17c and 17d and a method of manufacturing the stack of the first QD containing layer 17c, the QD light emitting layer 18, and the second QD containing layer 17d may be sufficiently understood from the above descriptions about the QD-LED 10 of FIG. 2, and descriptions about the materials and the manufacturing method will be omitted herein.

As illustrated in FIG. 12, the QD multilayer 16" may be configured such that the band gaps of first and second QD containing layers 17c and 17d may be greater than that of the QD light emitting layer 18 positioned therebetween. In addition, the QD multilayer 16 may be configured such that the energy band levels of the QD light emitting layer 18, the first QD containing layer 17c and the HTL 15 may be each be sequentially higher than a preceding level. In such an embodiment, since the carrier injected into the QD light emitting layer 18 is confined by the first and second QD containing layers 17c and 17d, optical confinement may be improved. Accordingly, an effective band offset between the HTL 15 and the QD light emitting layer 18 may be substantially reduced.

In the QD-LED 50 illustrated in FIGS. 11 and 12, first and second dielectric layers may replace the HTL 15 and the ETL 20. That is, the charge transport layer may be replaced with a dielectric layer. When the first and second dielectric layers are provided to function as the HTL 15 and the ETL 20, an alternating current ("AC") operation is possible, e.g., via the addition of an AC generator in connection with the first and second electrodes 14 and 22.

While the above embodiments have been described as including an HTL and an ETL, alternative embodiments include configurations wherein either, or both, may be omitted. In addition, alternative embodiments include configurations wherein HBLs or EBLs may also be included. Alternative embodiments also include configurations wherein HTLs and ETLs or HILs and HTLs may be combined to form HTL-ETLs or HIL-HTLs.

In addition, while light emission has been mainly described with respect to the QD light emitting layer 18, light emission may also be generated in the QD containing layer. As such, the light emission of the QD containing layer may be selected to have a wavelength equal to or different than a wavelength of the light emission of the QD light emitting layer. Because the different layers may have different wavelengths, the overall light emission, i.e., the emission generated by both the QD light emitting layer and the QD containing layer, may be selected to be a particular color, e.g., red, green or blue, or a combination of colors, e.g., white.

As described above, according to the one or more of the above embodiments, since a difference in the energy band level between the QD light emitting layer and the HTL may be reduced by using the QD containing layer having an energy band level different from that of the QD light emitting layer, in addition to the QD light emitting layer, the efficiency of the QD-LED may be improved even when a known HTL is used.

It should be understood that the embodiments described herein should be considered in a descriptive sense only and not for purposes of limitation. Descriptions of features or aspects within each embodiment should typically be considered as available for other similar features or aspects in other embodiments.

What is claimed is:

1. A quantum dot light emitting device comprising:
   a substrate;
   a first electrode disposed on the substrate;
   a second electrode disposed substantially opposite to the first electrode;
   a first charge transport layer disposed between the first electrode and the second electrode;
   a quantum dot light emitting layer disposed between the first charge transport layer and one of the first electrode and the second electrode; and
   at least one quantum dot including layer disposed between the quantum dot light emitting layer and the first charge transport layer, wherein the at least one quantum dot including layer has an energy band level different from an energy band level of the quantum dot light emitting layer.

2. The quantum dot light emitting device of claim 1, wherein an energy band gap of the quantum dot light emitting layer and an energy band gap of the quantum dot containing layer are substantially the same.

3. The quantum dot light emitting device of claim 2, wherein the at least one quantum dot including layer comprises a single quantum dot including layer, and energy band levels of the quantum dot light emitting layer, the quantum dot including layer and the hole transport layer are arranged to each be sequentially higher than the preceding layer.

4. The quantum dot light emitting device of claim 2, wherein the first charge transport layer includes a hole transport layer and the at least one quantum dot including layer comprises a first quantum dot including layer and a second quantum dot including layer, and energy band levels of the quantum dot light emitting layer, the first quantum dot including layer, the second quantum dot including layer and the hole transport layer are arranged to each be sequentially higher than the preceding layer.

5. The quantum dot light emitting device of claim 2, wherein the at least one quantum dot including layer comprises a first quantum dot including layer and a second quantum dot including layer respectively arranged at opposing sides of the quantum dot light emitting layer, and band gaps of the first quantum dot including layer and the second quantum dot including layer are greater than a band gap of the quantum dot light emitting layer.

6. The quantum dot light emitting device of claim 5, wherein the first charge transport layer includes a hole transport layer and the first quantum dot including layer, the quantum dot light emitting layer and the second quantum dot including layer are sequentially stacked on the hole transport layer, and energy band levels of the quantum dot light emitting layer, the first quantum dot including layer and the hole transport layer are arranged to each be sequentially higher than the preceding layer.

7. The quantum dot light emitting device of claim 1, further comprising:
   a second charge transport layer disposed between the first electrode and the second electrode.

8. The quantum dot light emitting device of claim 7, wherein one of the first charge transport layer and the second charge transport layer is a hole transport layer and the other of the first charge transport layer and the second charge transport layer is an electron transport layer, and the at least one quantum dot including layer is disposed on the hole transport layer and the quantum dot light emitting layer is disposed on the at least one quantum dot including layer.

9. The quantum dot light emitting device of claim 8, wherein the at least one quantum dot including layer comprises a single quantum dot including layer, and energy band levels of the quantum dot light emitting layer, the quantum dot including layer and the hole transport layer are arranged to each be sequentially higher than the preceding layer.

10. The quantum dot light emitting device of claim 8, wherein the at least one quantum dot including layer comprises a first quantum dot including layer and a second quantum dot including layer, and energy band levels of the quantum dot light emitting layer, the first quantum dot including layer, the second quantum dot including layer, and the hole transport layer are arranged to each be sequentially higher than the preceding layer.

11. The quantum dot light emitting device of claim 7, wherein the first charge transport layer and the second charge transport layer comprise a dielectric material, and the at least one quantum dot including layer comprises a first quantum dot including layer and a second quantum dot including layer respectively arranged at opposing sides of the quantum dot light emitting layer.

12. The quantum dot light emitting device of claim 11, wherein band gaps of the first quantum dot including layer and the second quantum dot including layer are each greater than a band gap of the quantum dot light emitting layer.

13. The quantum dot light emitting device of claim 12, wherein the first quantum dot including layer, the quantum dot light emitting layer and the second quantum dot including layer are sequentially stacked on one of the first charge transport layer and the second charge transport layer, and energy band levels of the quantum dot light emitting layer, the first quantum dot including layer and the one of the first charge transport layer and the second charge transport layer are arranged to each be sequentially higher than the preceding layer.

14. The quantum dot light emitting device of claim 11, wherein the first quantum dot including layer, the quantum dot light emitting layer and the second quantum dot including layer are sequentially stacked on one of the first charge transport layer and the second charge transport layer, and energy band levels of the quantum dot light emitting layer, the first quantum dot including layer and the one of the first charge transport layer and the second charge transport layer are arranged to each be sequentially higher than the preceding layer.

15. The quantum dot light emitting device of claim 10, further comprising:
   an alternating current generator connected to the first electrode and the second electrode.

16. The quantum dot light emitting device of claim 1, wherein the quantum dot light emitting layer and the quantum dot containing layer both include a plurality of quantum dots, each of the plurality of quantum dots including a quantum dot core and a first organic ligand, and
wherein the plurality of quantum dots corresponding to the quantum dot containing layer further include a second organic ligand.

17. The quantum dot light emitting device of claim 1, wherein an energy band gap of the quantum dot light emitting layer and an energy band gap of the quantum dot containing layer are different.

18. A method of forming a quantum dot light emitting device, the method comprising:
providing a substrate;
providing a first electrode on the substrate;
disposing a quantum dot containing layer having a first energy band level on the first electrode;
disposing a quantum dot light emitting layer having a second energy band level on the quantum dot containing layer, wherein the second energy band level is different than the first energy band level; and
disposing a second electrode on the quantum dot light emitting layer.

19. The method of forming a quantum dot light emitting device of claim 18, wherein the disposing a quantum dot containing layer having a first energy band level on the first electrode comprises processing a surface of a plurality of quantum dots disposed within the quantum dot containing layer.

* * * * *